United States Patent
Popescu

(10) Patent No.: US 9,291,689 B2
(45) Date of Patent: Mar. 22, 2016

(54) MRT SYSTEM, RECEIVE APPARATUS FOR AN MRT SYSTEM AND METHOD FOR OBTAINING AN MR SIGNAL IN AN MRT SYSTEM

(71) Applicant: Stefan Popescu, Erlangen (DE)

(72) Inventor: Stefan Popescu, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 630 days.

(21) Appl. No.: 13/679,772

(22) Filed: Nov. 16, 2012

(65) Prior Publication Data

US 2013/0127461 A1   May 23, 2013

(30) Foreign Application Priority Data

Nov. 17, 2011   (DE) .......................... 10 2011 086 561

(51) Int. Cl.
*G01V 3/00*   (2006.01)
*G01R 33/341*   (2006.01)
*G01R 33/48*   (2006.01)
*G01R 33/36*   (2006.01)

(52) U.S. Cl.
CPC .......... *G01R 33/341* (2013.01); *G01R 33/3692* (2013.01); *G01R 33/48* (2013.01); *G01R 33/3621* (2013.01)

(58) Field of Classification Search
CPC ..................................... G01R 33/341
USPC ........................................... 324/309
See application file for complete search history.

(56) References Cited

U.S. PATENT DOCUMENTS

| 5,243,287 | A |   | 9/1993  | Hashoian et al. |         |
|-----------|---|---|---------|------------------|---------|
| 5,739,936 | A | * | 4/1998  | Yakymyshyn et al.| 398/145 |
| 6,160,626 | A | * | 12/2000 | Debeau et al.    | 356/451 |
| 7,079,780 | B1|   | 7/2006  | Rollins          |         |
| 7,508,213 | B2|   | 3/2009  | Koste            |         |

(Continued)

FOREIGN PATENT DOCUMENTS

CN   101103918 A   1/2008
JP       6047017   2/1994

(Continued)

OTHER PUBLICATIONS

Biber S., et.al. "Analog Optical Transmission of 4 MRI Receive Channels with High Dynamic Range Over One Single Optical Fiber", in: Proc. Int.Soc. Magn. Reson. Med. Annu. Meeting, Toronto, Canada, 2008.

(Continued)

*Primary Examiner* — Rodney Fuller
(74) *Attorney, Agent, or Firm* — Lempia Summerfield Katz LLC

(57) ABSTRACT

A receive apparatus in a strong magnetic alternating field is disposed in a magnetic resonance tomography (MRT) system. The MRT system includes at least one receive apparatus for a magnetic resonance high frequency (MR-HF) signal. The receive apparatus includes a receive coil element for receiving the MR-HF signal, an optical modulator, in which an electrical control input is coupled to the receive coil element, and an optical output for outputting an output signal of the modulator. The optical modulator forms an optical demodulation device for the MR-HF signal. The optical modulator is coupled to a laser light source via an optical input that is configured to generate a laser light. A light intensity of the laser light varies periodically with a predetermined frequency.

19 Claims, 6 Drawing Sheets

(56) References Cited

U.S. PATENT DOCUMENTS

| | | | |
|---|---|---|---|
| 7,852,082 B2 | 12/2010 | Tolliver et al. | |
| 2004/0019273 A1 | 1/2004 | Helfer et al. | |
| 2005/0012934 A1* | 1/2005 | Szafraniec | 356/484 |
| 2006/0066311 A1* | 3/2006 | Koste et al. | 324/322 |
| 2008/0146907 A1* | 6/2008 | Koste | 600/407 |
| 2009/0208220 A1 | 8/2009 | Lagasse | |

FOREIGN PATENT DOCUMENTS

| | | |
|---|---|---|
| JP | 2000356759A A | 12/2000 |
| JP | 2005270304 A | 10/2005 |
| JP | 2006517416 A | 7/2006 |
| JP | 2007232468 A | 9/2007 |
| JP | 2007232469 A | 9/2007 |
| KR | 20060098547 A | 9/2006 |
| WO | WO2011001324 A1 | 1/2011 |

OTHER PUBLICATIONS

Koste et. al.; Optical MR Receive Coil Array Interconnect; Proc. Intl. Soc. Mag. Reson. Med. Annu. Meeting, Miami, FL, pp. 411, 2005.

Losio, Giacomo / "Silicon Photonics: A Field that is Constantly Changing", in: Photonics Spetra, pp. 78-80, Jan. 2015.

Yuan Jing, et.al. "A 4-Channel Coil Array Interconnection by Analog Direct Modulation Optical Link for 1.5-T MRI", in: IEEE Transactions on Medical Imaging, vol. 27, No. 10, pp. 1432-1438, Oct. 2008.

Japanese Office Action for Japanese Patent Application No. 2012-251504, mailed Mar. 23, 2015 with English Translation.

Korean Office Action for Korean Application No. 9-5-2015-078229493, mailed Nov. 11, 2015, with English Translation.

Chinese Office action for related Chinese Application No. 2012104644757, dated Dec. 1, 2015, with English Translation.

* cited by examiner

MRT SYSTEM, RECEIVE APPARATUS FOR AN MRT SYSTEM AND METHOD FOR OBTAINING AN MR SIGNAL IN AN MRT SYSTEM

This application claims the benefit of DE 10 2011 086 561.6, filed on Nov. 17, 2011, which is hereby incorporated by reference.

BACKGROUND

The present embodiments relate to a magnetic resonance tomography system (MRT system) having at least one receive apparatus for receiving an electromagnetic and/or magnetic MR-HF signal that is radiated by a body to be examined.

An MRT system and a receive apparatus are known, for example, from U.S. Pat. No. 7,508,213 B2.

With a system for generating magnetic resonance tomograms, a body to be examined (e.g., the body of a person or animal or a material sample) is introduced into a magnetic field that is generated, for example, by a superconducting magnetic coil of the MRT system. The body is made to transmit a high frequency magnetic or electromagnetic response signal by emitting a high frequency magnetic alternating field. The frequency of the response signal is dependent on the field strength of the magnetic field and amounts approximately to 42 megahertz per Tesla. To distinguish between individual regions in the body, gradient fields cause individual voxels (e.g., volume elements) of the body to emit response signals that differ from one another by a few hundred kilohertz. The high frequency signal mixture emitted by the voxels is referred to, for example, as MR-HF signal.

The MR-HF signal is received by at least one receive coil element of the MRT system and is converted by the element into an electrical MR-HF signal. The entire overlaid signals of the individual voxel are to be demodulated from the high frequency range (HF range) to an intermediate frequency range or a basic frequency range. The electrical MR-HF signal of the receive coil element is amplified if necessary and fed to a mixer after an impedance adjustment, the mixer mixing down or demodulating the HF-MR signal into the intermediate frequency range or the base band. The signal demodulated into the intermediate frequency or basic frequency range is referred to below as an MR signal.

The receive coil elements are disposed in a receive apparatus that is located in the magnetic field of the MRT system. This makes it difficult to operate further complex electrical circuits in the receive apparatus. The relatively strong magnetic alternating fields render complex shielding measures necessary. Furthermore, the waste heat of such circuits causes a thermal signal noise that may disturb the MR-HF signal. Voluminous electrical circuits also render the receive apparatus unwieldy, which, particularly with devices for examining living patients, render it difficult for these receive apparatuses to be fixed to the patient for a long time. Furthermore, it may be unpleasantly hot for the patient on account of the waste heat of the devices.

The receive apparatus may thus solely be equipped with required components. Further components are accommodated in a magnetically shielded area (e.g., a control room of the MRT system). The receive apparatus may be connected to this evaluation device by way of coaxial cables. The coaxial cables guide the amplified electrical MR-HF signals out of the magnetic field. The amplified electrical MR-HF signals are then demodulated and further processed in the evaluation device. Since an MRT system may include a plurality of receive coil elements, the cable loom including coaxial cables is very unwieldy. On account of the plurality of transmitted signals, cross-talk between the individual coaxial cables may only be prevented with significant effort. A common mode current is to be prevented from being induced into the casing of the coaxial cable on account of the magnetic alternating fields of the magnet system. Common mode chokes or sheath current filters are thus used along the coaxial cable. On account of the large magnetic field strengths, these filters may not be provided by ferrite cores, but instead only in the form of resonant circuits (e.g., bazookas). In this way, the sheath current filters are to be at a distance from a quarter wavelength of the sheath currents. With a field strength of 3 Tesla, the distance therefore amounts to 15 cm, for example. This again renders the receive apparatus undesirably unwieldy.

An MRT system is described in U.S. Pat. No. 7,508,213 B2, in which an MR-HF signal is optically transmitted via optical waveguides out of the magnetic field into a control room of the MRT system. With this system, the receive apparatus includes an optical modulator, to the electrical control input of which a receive coil element is connected. A laser light with a constant light intensity is fed to the modulator. The light intensity of the laser light is modulated by the optical modulator as a function of the MR-HF signal generated by the receive coil element. The output signal of the optical modulator is transmitted via the optical waveguides to an opto electronic converter of a magnetically shielded evaluation device, which converts the optical signal back into an electrical MR-HF signal. The electrical MR-HF signal is then fed to a mixer for demodulation purposes.

SUMMARY AND DESCRIPTION

The system discussed above is disadvantageous in that the additional optical components increase the manufacturing costs of the MRT system. The optical modulator uses an electrical power supply in order to operate a switching circuit for provision of a bias voltage. This bias voltage sets an operating point of the modulator. An electrical connection is also provided to the input apparatus in addition to the optical connection. The unwieldy common mode chokes on the receive apparatus may not be dispensed with.

The present embodiments may obviate one or more of the drawbacks or limitations in the related art. For example, the circuit outlay for obtaining a magnetic resonance (MR) signal from a high frequency MR-HF signal in a magnetic resonance tomography (MRT) system is simplified.

With the MRT system, a receive apparatus is provided. Using the MRT system, an MR-HF signal emitted on account of magnetic resonance (e.g., from a body to be examined) is received by at least one receive coil element. The receive apparatus also includes an optical modulator, an electrical control input of which is coupled to the at least one receive coil element. The intensity of a laser light may be modulated as a function of the MR-HF signal of the receive coil element using the optical modulator in the receive apparatus. The optical output signal of the modulator modulated in such a way in the light intensity is output to an optical output of the receive apparatus. The optical output signal may be guided via a light guiding device (e.g., an optical waveguide) out of the magnetic field of the MRT system and transmitted to an evaluation device.

With the MRT system, the optical modulator of the receive apparatus forms an optical demodulation device for the MR-HF signal of the at least one receive coil element. An optical input of the modulator is coupled to a special laser light source. The laser light source is configured to generate a laser light, the light intensity of which is not constant over time, but instead varies periodically with a predetermined frequency.

Operation of the MRT system allows for implementation of the following method for generating an MR signal. The electromagnetic and/or magnetic MR-HF signal of the body to be examined is received in the magnetic field of the MRT system using the coil element and is converted into an electrical MR-HF signal using the at least one coil element. The optical modulator modulates a light intensity of the laser light that the optical modulator receives from a laser light source as a function of the electrical MR-HF signal. The laser light is generated, for example, by the laser light source that already varies periodically from an intensity of the laser light with a predetermined frequency. Since a laser light already periodically fluctuating in the light intensity is modulated again with the MR-HF signal by the modulator, a demodulation of the MR-HF signal is produced in the optical output signal of the modulator (e.g., the temporal curve of the light intensity of the output signal includes the MR signal as the demodulated MR-HF signal).

The MR system and the method are advantageous in that no additional electrical or digital mixer is to be provided in order to obtain a demodulated MR signal. The down mixing is produced automatically during the electro-optical conversion in the receive apparatus. The low pass filtering of the down-mixed signal subsequently provided for an adequate demodulation is also produced at least partly by the down-mixed signal during the optoelectronic conversion in the evaluation device.

The MRT system also allows the described laser light source to be arranged outside of the receive apparatus. The laser light is transmitted via a light guiding device to the receive apparatus. The laser light source may therefore advantageously be operated outside of the receive apparatus in a magnetically shielded area. The laser light source, therefore, may not be shielded comprehensively from induction currents, and also does not require any common mode chokes on electrical supply lines.

No opto-electronic receive elements operable to convert an optical signal modulated with a frequency of several 10 MHz to above 100 MHz are required in the evaluation device. The optical signal received in the evaluation device is already demodulated in an intermediate frequency band or the base band so that, accordingly, more cost-effective components may be used. In one embodiment of the MRT system, the optoelectronic converter is selected in a very special manner. With the optoelectronic converter, the optical output signal of the modulator, which is transmitted via a light-guiding device from the receive apparatus to the evaluation device, is converted into an electrical signal. Such an opto-electronic converter (e.g., a photodiode) may have an optical sensitivity that is dependent on a modulation frequency of the optical output signal to be converted. This sensitivity may include a structurally-specific low pass characteristic. In conjunction with the MRT system, an opto-electronic converter, in which the limit frequency of the low pass characteristic lies between the two mixed products formed by demodulation, may be provided. The term mixed products may be two frequency bands produced in a known manner during demodulation, of which one results from the difference between the demodulated HF signal and the modulation frequency and the other from the total of these frequencies. The high frequency portion (e.g., HF signal frequency+modulation frequency) is attenuated by a low pass for a fault-free further processing of the demodulated signal (e.g., of the MR signal). This may take place without any additional circuitry outlay at least in part by the opto-electronic converter by selecting a converter with a correspondingly small limit frequency. A further advantage is that a converter with a small limit frequency may be embodied similarly to a larger photo-sensitive surface and therefore has a correspondingly larger sensitivity to signals below the limit frequency than an equivalent converter, such as has to be provided in a conventional MRT system for receiving the MR-HF signal.

The modulation frequency is the frequency already mentioned, with which the laser light source varies the light intensity of the output laser light. The frequency may lie in a range of 50 MHz to 500 MHz. This allows MR-HF signals for all current MRT field strengths (e.g., one Tesla to eleven Tesla) to be demodulated into intermediate frequency ranges for the further processing or into the basic frequency range.

With the MRT system, an optical splitter that is configured to distribute the laser light of the laser light source to a plurality of receive apparatuses and/or a plurality of modulators within a receive apparatus is provided. The laser light of a single laser light source is sufficient, on account of the sensitive opto-electronic converter, to transmit the signals of a plurality of receive coil elements optically from the magnetic field of the MRT system into a magnetically shielded area.

In conjunction with a technical realization of the described laser light source, in one embodiment, the optical modulator includes a Mach-Zehnder modulator in order to vary the light intensity. A Mach-Zehnder modulator may be provided in already existing models of MRT systems, so that the MRT system may be trained to implement the method.

The optical modulator in the receive apparatus also includes a Mach-Zehnder modulator. Current Mach-Zehnder modulators include the already described disadvantage in that a bias circuit that is to be provided with electrical energy is used to set an operating point. Thus, the receive apparatus is provided with an electrical supply line that is to be shielded with a common mode choke.

A Mach-Zehnder modulator includes an optical input for receiving a laser and an optical output for outputting the modulated laser light. The optical input is connected to the optical output via two optical propagation paths. By applying an electrical voltage to an electrical control input of the Mach-Zehnder modulator, the basis of the Kerr effect may be achieved such that the optical path lengths of the two optical propagation paths differ more the greater the amount of control voltage applied. Accordingly, a phase shift is produced at the optical output between the light beams arriving at the optical output via the different propagation paths. The light beams then accordingly interfere in a more or less destructive manner. In one embodiment of the MRT system, a Mach-Zehnder modulator, in which optical wavelengths of the two propagation paths already differ because of the construction of the modulator, is provided. This produces an interference at the optical output even if no voltage is applied to the electrical control unit. In other words, an optical bias is effected without an electrical circuit. A phase shift of 90° may be effected by the different optical wavelengths of the two propagation paths for a wavelength of the used laser light, so that with a control voltage of 0 V, a transmission T of the modulation amounts to T=50%.

One embodiment of the Mach-Zehnder modulator further reduces the requirement of the receive apparatus for electrical energy. A Mach-Zehnder modulator is provided as an optical modulator, the active modulation length of which is greater than 1 cm (e.g., greater than 2 cm or greater than 3 cm). The active modulation length is the length of the area, across which the electrical field of the electrical control signal acts on the optical input signal in the Pockel or Kerr cell. With large modulation lengths of this type an electrical preamplifier for the MR-HF signal in the receive apparatus may be dispensed with. In order also to obtain an optical modulation with a good signal quality in an MRT system having a relatively strong basic field of five Tesla (e.g., greater than ten Tesla), the optical modulator in the receive apparatus may also be configured as a travelling wave modulator.

A switching device of the receive apparatus including further, electrical energy is the tuning and detuning device in MRT systems. This prevents excitation signals that excite the body in order to emit the electromagnetic and/or magnetic MR-HF signal from generating a receive signal with a critical electrical voltage in the receive coils. An embodiment of the MRT system provides for a tuning and detuning device that has no external electrical energy requirement. Instead, the tuning and detuning device may be switched as a function of a strength of the receive signal of the receive coil element. If the receive signal exceeds a determined voltage level, this overvoltage is used to detune the receive coil element passively (e.g., using the energy received by the receive coil element). This may be achieved, for example, with transistors connected in an anti-parallel manner, which bridge a resonance circuit of the receive coil element.

In one embodiment, a tuning and detuning device that may be switched optically may be provided. A corresponding switching signal and, if necessary, also the energy for operating the components of the tuning and detuning device may be transmitted to the receive apparatus by way of the same light guiding facility, via which the laser light of the laser light source is also transmitted.

One exemplary simplification of the structure of a receive apparatus is produced if a plurality of tuning and detuning devices, by way of which the receive coil elements of an array of the receive apparatus may be tuned and detuned, may be switched by the same signal.

The described developments overall enable the provision of a receive apparatus that may be completely operated without an external electrical power supply or at least with a very small electrical energy outlay. Any possible remaining energy requirement is low such that the remaining energy requirement may be provided by a battery mounted in the receive apparatus. In another embodiment of the MRT system, an energy transmission device, using which the required energy may be transmitted electromagnetically (e.g., optically or in the microwave range or by vibration) is provided. The use of electrical supply lines and thus the unwanted common mode chokes may be dispensed with. The lines for connecting the receive apparatus to the rest of the MRT system may be configured in a very slim and manageable manner.

Aside from the MRT system, a receive apparatus for the MRT system is also provided. The receive apparatus includes the features and developments, as have been described above in conjunction with the MRT system. The receive apparatus is therefore not described once again in detail.

DETAILED DESCRIPTION OF THE DRAWINGS

Figure 1:
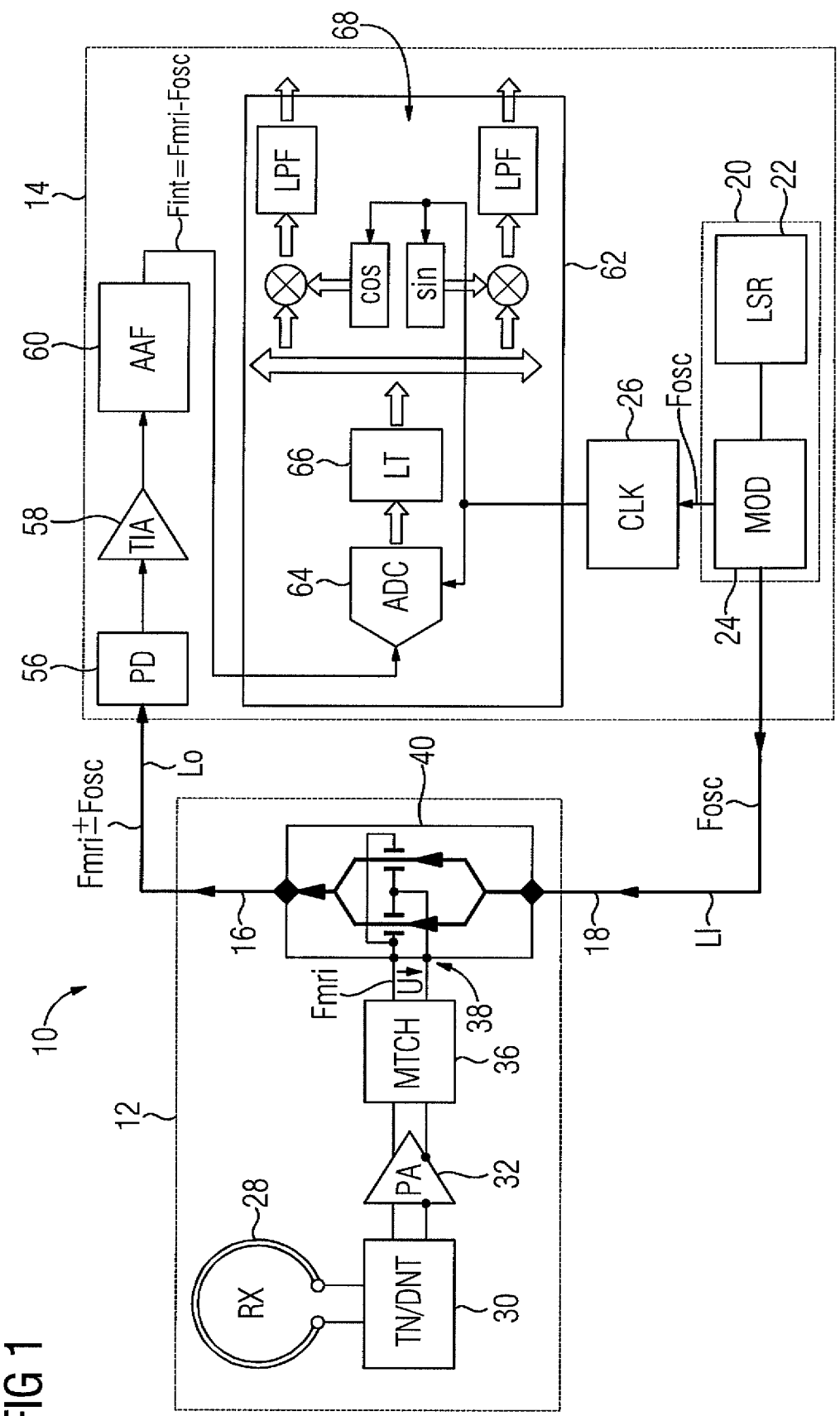
FIG. 1 shows a block diagram of one embodiment of a magnetic resonance tomography (MRT) system.

FIG. 1 shows one embodiment of a magnetic resonance tomography system or MRT system 10 including a receive apparatus 12 and an evaluation device 14. The MRT system 10 may also include further receive apparatuses of a comparable type, in addition to the receive apparatus 12 shown. The receive apparatus 12 may, for example, be fastened to a human or animal patient by a bandage or another type of fastening apparatus. The patient may be disposed, for example, on a couch in a magnetic basic field of a coil magnet (not shown) of the MRT system 10. The evaluation device 14 is disposed outside of the room with the coil magnets and is magnetically shielded herefrom. The receive apparatus 12 is connected to the evaluation device 14 by way of two optical guiding devices 16, 18. The optical guiding devices 16, 18 may be optical waveguides or waveguides. The receive apparatus 12 is very flat and light so that the receive apparatus 12 neither disturbs nor constricts the patient. The connections of the optical conducting devices 16, 18 are also very small and light. The requirement of the receive apparatus for electrical energy is low such that no electrical cables have to be used with the sheath current filters.

In the MRT system 10, the magnetic resonance high frequency (MR-HF) signal of the body is demodulated in the receive apparatus 12 and is transmitted as a demodulated signal to the evaluation device 14. The receive apparatus 12 does not use any electrical components for the demodulation. Instead, the receive device 12 receives an input laser beam LI via the guiding device 18, the light intensity of which oscillates at a frequency $F_{osc}$ over time and which is used as an optical demodulation signal. The light intensity oscillates, for example, in a sinusoidal manner. The light intensity may, however, also change according to another periodic function, for example, according to a square wave, a saw tooth or a triangular oscillation. The input laser beam LI is generated by a laser light source 20. The laser light source 20 includes a laser 22 and a modulation device 24 for varying the intensity of the laser light. The laser 22 may generate the laser light, for example, using a VCSEL laser diode, a Fabry-Perot laser diode, or a distributed feedback laser-diode. The modulator 24 may be a Mach-Zehnder modulator. An electrical control signal receives the modulator 24 from a clock 26 of the evaluation device 14. The modulation frequency may amount, for example, to 125 MHz. The modulation frequency is set as a function of a field strength of the magnetic basic field of the magnetic coil in the clock 26.

The receive apparatus 12 receives a magnetic resonance signal from a body of the patient using a receive coil 28, the average frequency Fmri of which may amount, for example, to 123 MHz. The average frequency depends on an intensity of a magnetic basic field of the magnetic coil of the MRT system 10. The receive coil 28 converts the response signal of the body into an electrical signal that is fed via a first impedance adjustment circuit 30 to a power amplifier 32. An output signal of the power amplifier 32 is transmitted via a further circuit 36 for adjusting an impedance and for filtering the output signal to an electrical control input 38 of an optical modulator 40, where the signal acts as a control voltage U. An average frequency of the control signal U amounts, for example, to $F_{mri}$=123 MHz. The control signal U is an MR-HF signal that contains image information for a magnetic resonance imaging (MRI).

The circuit 30 also includes a tuning (TN) and detuning (DTN) apparatus, that may be operated with energy from the receive coil 38. The amplifier 32 may be a low noise preamplifier that consumes very little electrical power. The electrical power may be provided to the preamplifier 32 using a battery (not shown) of the receive apparatus 12 or by way of an energy transmission facility that receives the energy, for example, from the evaluation device 14 electromagnetically or mechanically (vibrations). It is therefore not necessary to provide an electrical connection between the receive apparatus 12 and the remaining components of the MRT system 10.

Figure 2:
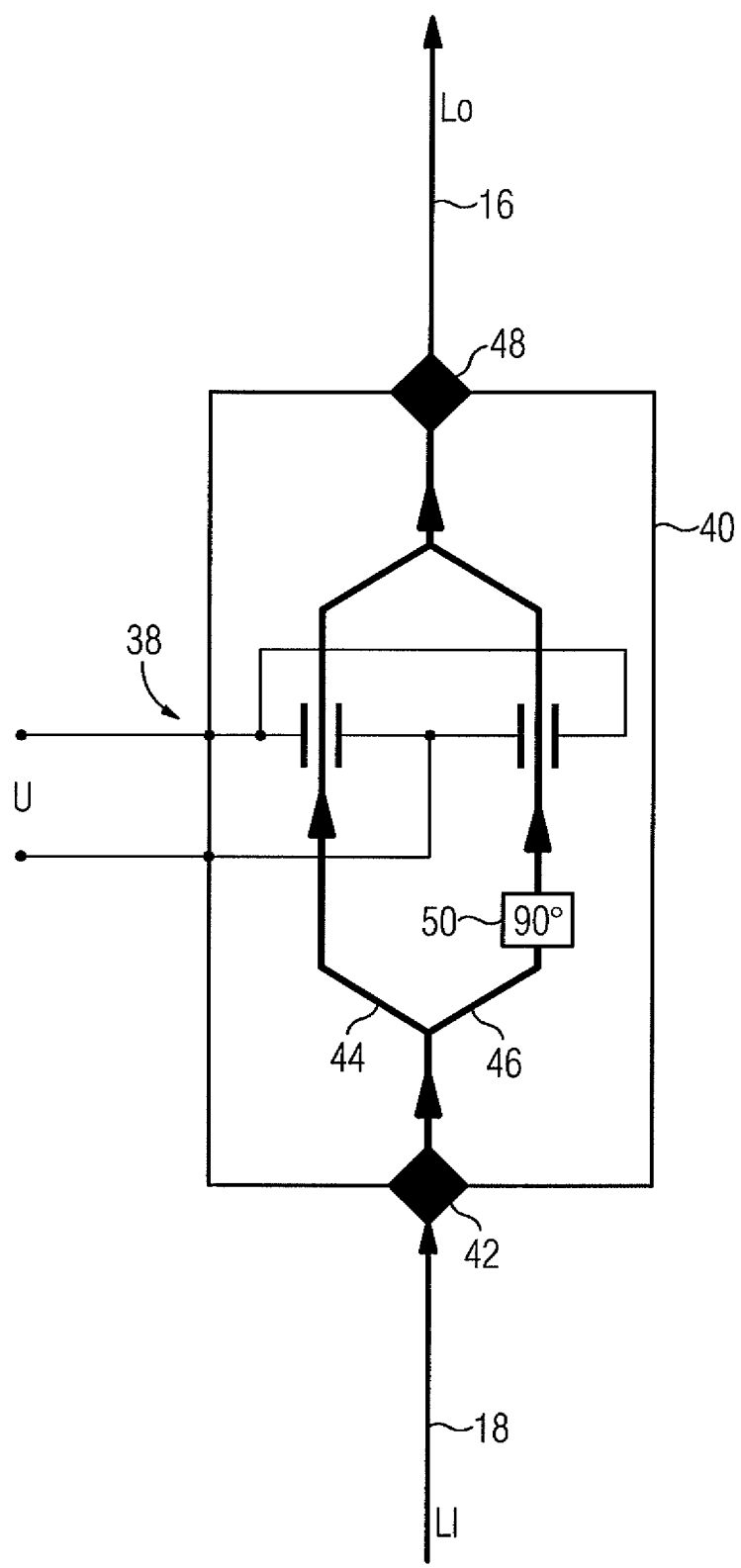
FIG. 2 shows a schematic representation of one embodiment of an optical modulator of a receive device of the MRT system in FIG. 1.
Figure 3:
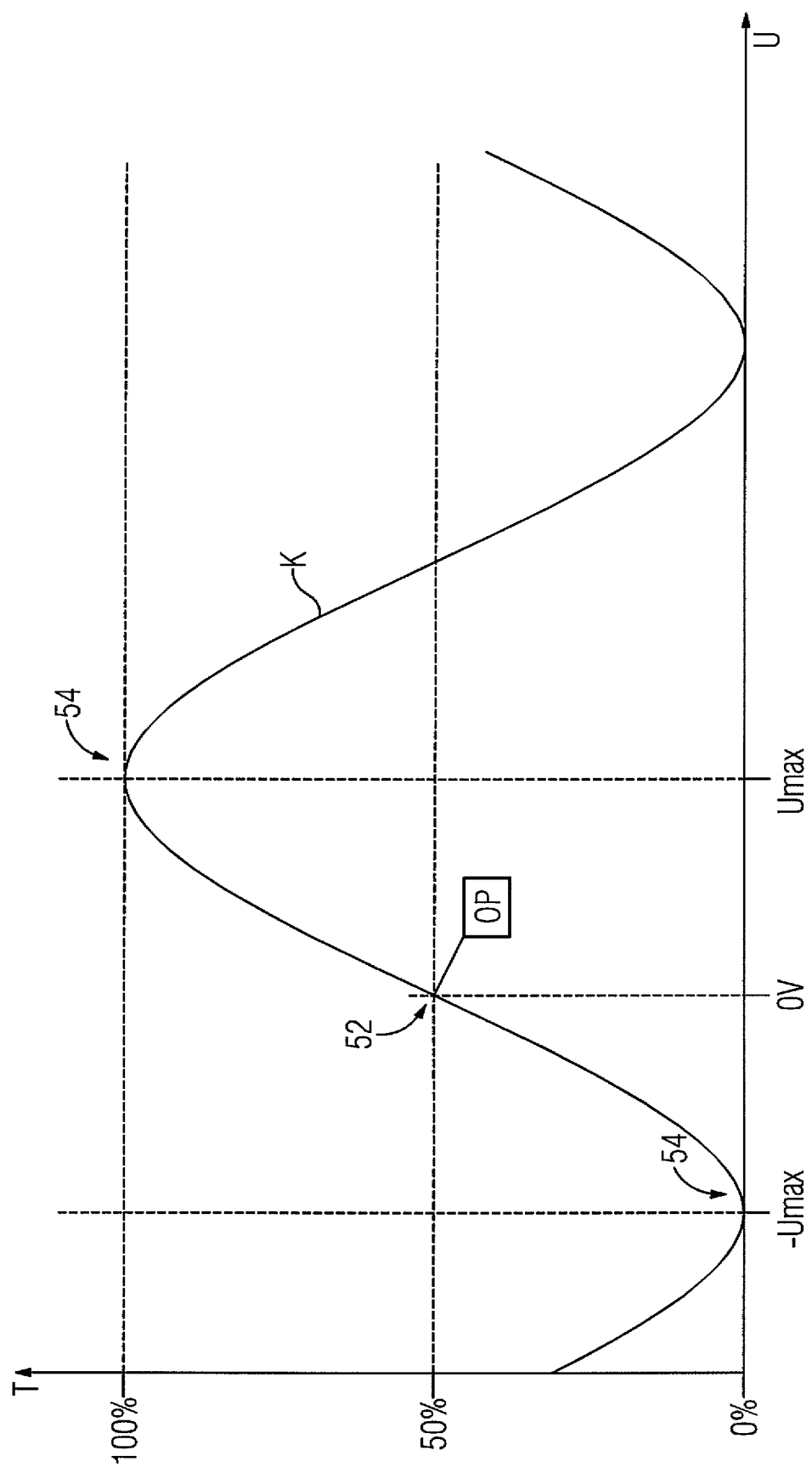
FIG. 3 shows a diagram with a graph for an exemplary transmission of the optical modulator in FIG. 2.

The optical modulator 40 may be a Mach-Zehnder modulator, for example. The functionality of the optical modulator 40 is described below in conjunction with FIG. 2 and FIG. 3. The optical modulator 40 receives the input laser beam LI via an optical input 42, from where the input laser beam LI is routed via two separate optical paths 44, 46 to an optical output 48, at which the two partial beams of the two paths 44, 46 join at an output laser beam LO. The light guiding device 16 is coupled to the optical output 48, so that the output laser beam LO is coupled into the light guiding device 16. The optical propagation paths 44, 46 may be produced, for example, on the basis of an electro-optical substrate (e.g., LiNbO3). The refractive index of such an electro-optical substrate is a function of a field strength of an electrical field penetrating the substrate. Changing the control voltage U accordingly sets an electrical field penetrating the respective optical propagation path between electrodes of the optical modulator 40. The electrical control voltage U acts on both optical paths 44, 46 in an opposite fashion, so that electro-optical elements of the propagation path 44, 46 change optical wavelengths with a given value of the control voltage U in the opposite manner With a control voltage U of 0 V (U=0 V), that of the optical modulator 14 overall has an optical transmission behavior that corresponds to a transmission T of T=50%. The transmission T represents a measure of the degree of interference between the two partial beams (100%=constructive interference, 0%=destructive interference). A change in the intensity of the laser beam results herefrom by the value of the voltage signal U. In order to obtain a transmission of T=50% at 0 V input voltage, the optical modulator 40 includes an optical bias element 50 in the optical propagation path 46. The bias element 50 shifts the partial beam routed through the optical propagation path 46 with respect to the partial beam routed via the propagation path 44 in the phase by 90°. For U=0 V, this produces the operating point OP of the optical modulator 40 at T=50%. A characteristic curve K of the transmission of the optical modulator 40 includes, for example, a linear area 52 with a maximum rigidity, so that the optical modulator 40 is particularly sensitive to small changes in the control signal U in the range of U=0 V. For large amplitudes, the amount of which lies close to Umax, the characteristic curve K includes compression areas 54. The receive signal of the receive coil 28 may be advantageously uniquely transmitted with relatively large dynamics.

The output laser beam LO emitted by the optical modulator 40 contains two variants of the receive signal of the receive coil 28 (e.g., a demodulated variant with an intermediate frequency Fint=($F_{osc}$−$F_{mri}$) and a second mixed product with an intermediate frequency ($F_{osc}$+$F_{mri}$)). The output laser beam LO is received by an opto-electronic converter 56 (e.g., a photodiode), the electrical output signal of which is adjusted by an impedance converter 58 and is then transmitted to an anti-aliasing filter 60. The converter 56 and the anti-aliasing filter 60 cause the high-frequency signal portion ($F_{osc}$+$F_{mri}$) to be suppressed, so that an output signal of the anti-aliasing filter 60 still only includes the demodulated receive signal of the receive coil 28 (e.g., an MR signal with the intermediate frequency Fint=($F_{osc}$−$F_{mri}$); Fint=2 MHz). The signal is transmitted to a processor unit 62 (e.g., a digital signal processor), where an analog-digital converter 64 generates a digital input signal therefrom, which is distorted by a distortion apparatus 66. Distortion cancels out the influence of the compression areas 54 of the characteristic curve K. The distortion apparatus may include, for example, a characteristic field (Lookup-Table) for the distortion. The input signal digitalized and distorted in this way is mixed down into a base band via a second, digital mixer 68 from the intermediate frequency band with the average frequency Fint and broken down in the process into quadrature components. The digital output values of the mixer 68 are fed to an image processor (not shown) for reconstruction of the magnetic resonance image.

An embodiment of the MRT system is explained below with the aid of FIG. 4 and FIG. 5, in which a receive apparatus has a particularly low requirement for electrical energy. In order to better illustrate the difference from the MRT system in FIG. 1, elements in FIG. 4 and FIG. 5 that may be embodied in the same way in the MRT system in FIG. 1, are provided with the same reference characters as in FIG. 1. These elements are also explained once more in conjunction with FIG. 4 and FIG. 5.

Figure 4:
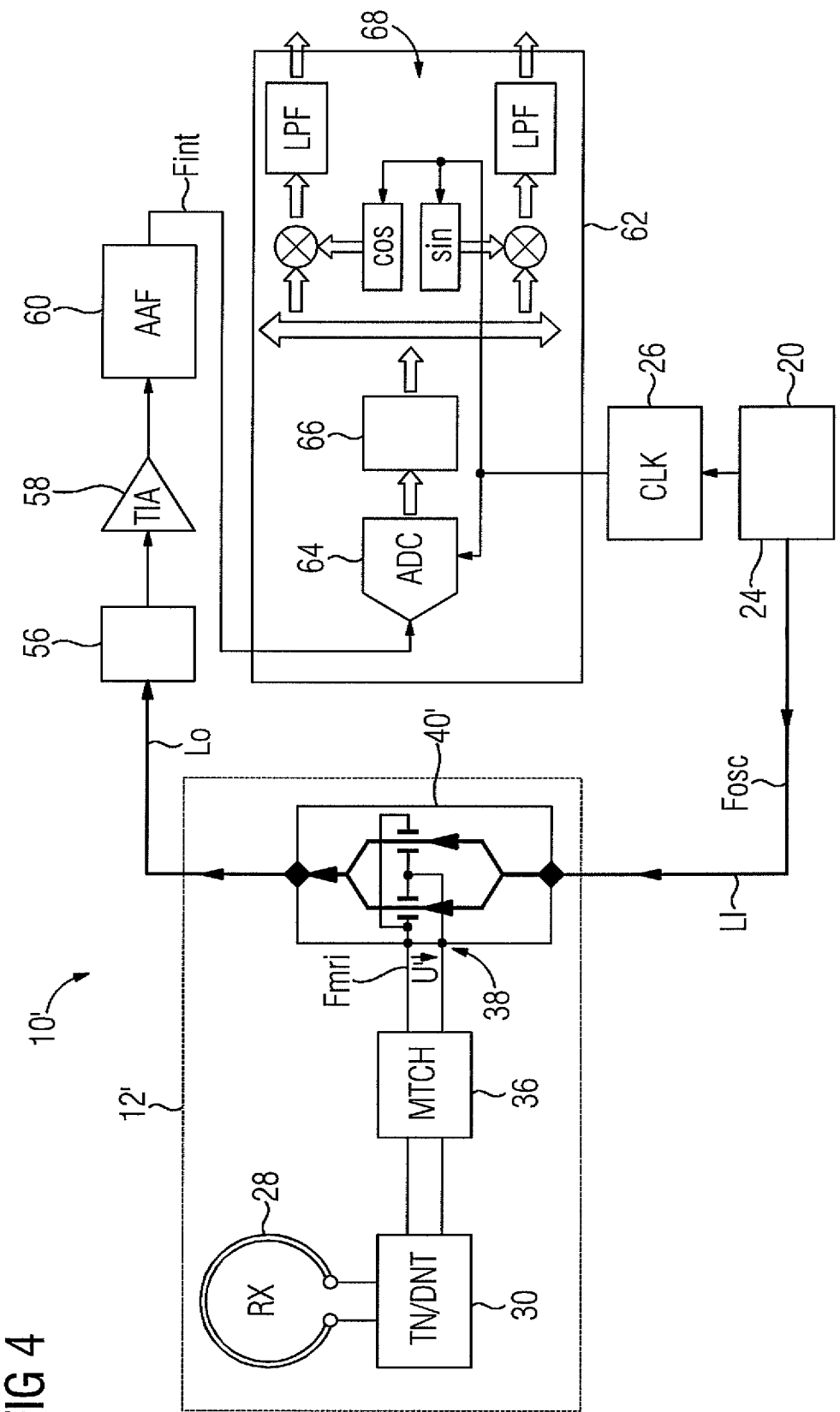
FIG. 4 shows a block diagram of one embodiment of an MRT system.
Figure 5:
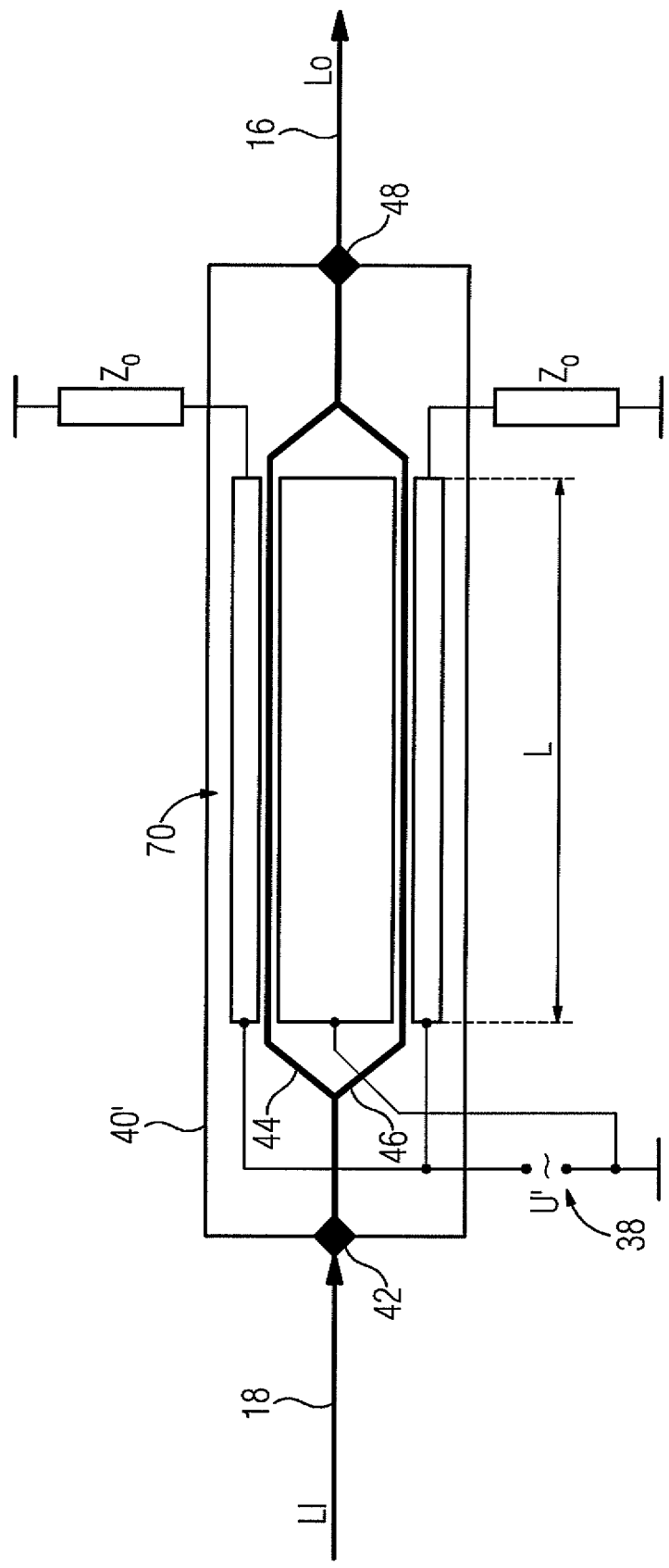
FIG. 5 shows a schematic representation of one embodiment of an optical modulator of a receive apparatus of the MRT system in FIG. 4.

In the MRT system 10' in FIG. 4, a receive apparatus 12' does not include a preamplifier like the preamplifier 32. Instead, the optical modulator 40' is embodied as a Mach-Zehnder modulator, in which an electro-optically active interaction path 70 has an active modulation length L that lies in a range of 20 mm to 40 mm. The active modulation length L amounts, for example, to L=31 mm. With the demodulation, an amplification of the MR-HF signal present as a control voltage U' is amplified by approximately 30 db, such as would otherwise have to be done by a preamplifier. The Mach-Zehnder modulator of the modulator 40' may also be embodied as a travelling wave modulator, as shown in FIG. 5. A bias element of the modulator 40' is not shown in FIG. 5.

A tuning and detuning device 30 and an impedance adjustment 36 are configured entirely as passive circuits. The tuning and detuning device 30 may, for example, include transistors connected in an anti-parallel manner for bridging an LC element or optically switchable elements.

Overall, the receive apparatus 12' forms a passive switching unit, to which no electrical energy has to be supplied from the outside.

Figure 6:
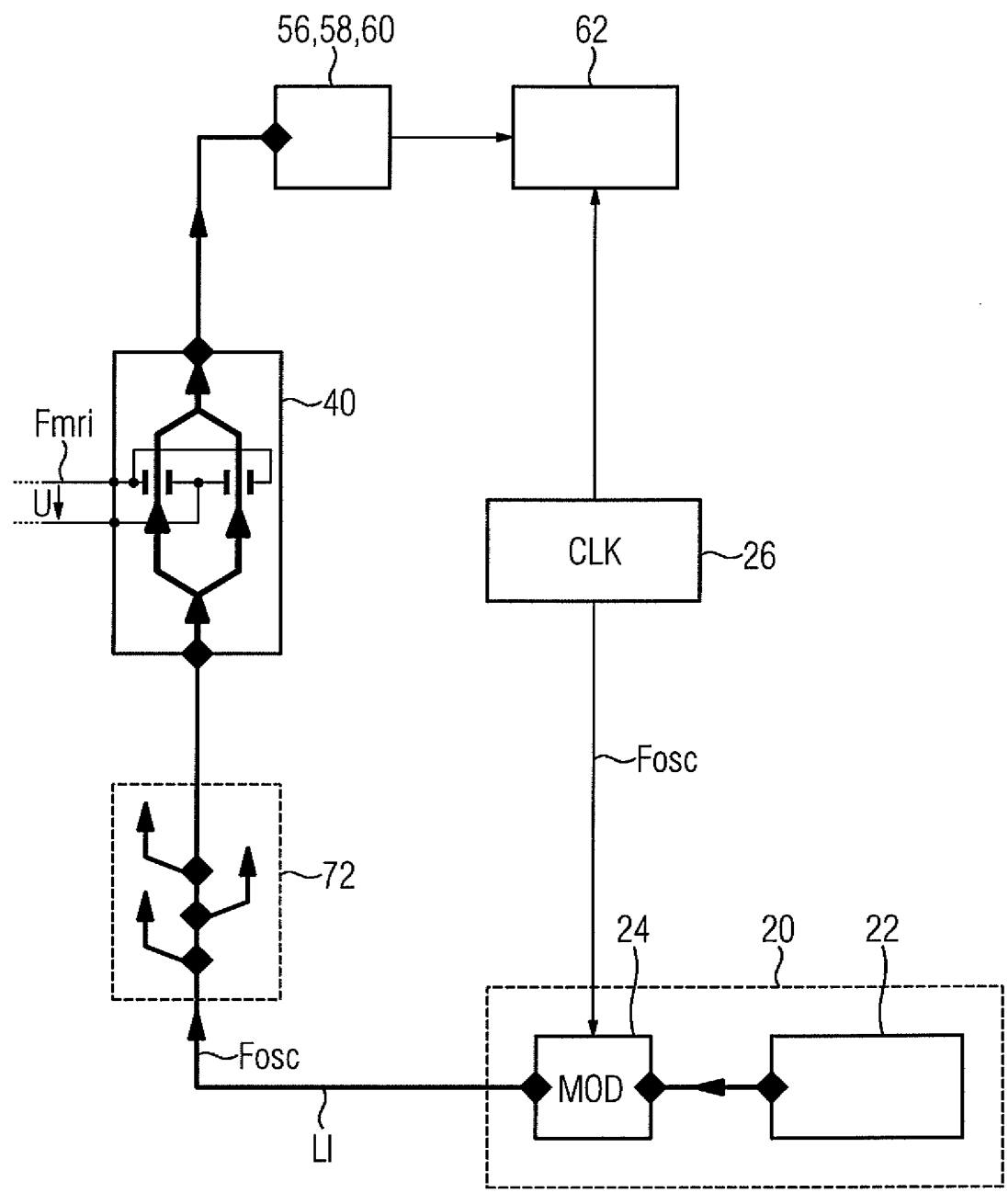
FIG. 6 shows a block diagram of one embodiment of an MRT system.

FIG. 6 shows how it is possible to benefit from the fact that an opto-electrical converter 56 may exhibit a particularly large sensitivity, since the upper limit frequency in the MRT system may be lower than in a conventional MRT system. In FIG. 6, elements that may correspond in terms of the structure in FIG. 1 are provided again for the sake of simplicity with the same reference characters as in FIG. 1.

The high sensitivity of the opto-electrical converter 56 renders it possible for the light of a single laser source 20 to be used to transmit a number of MR signals. The output laser beam LI of the laser source 20 is divided by an optical splitter device 72, and fed to a number of optical modulators, of which only one optical modulator 40 is shown in FIG. 6. The optical modulators may be components, for example, of the same receive apparatus and demodulate the signals of a receive coil array, for example. The optical splitter 72 may, however, also be arranged outside of receive apparatuses of the MRT system and distribute the output laser beam LI on several receive apparatuses. A number of optical splitter facilities may be provided in order to distribute the laser light both to a number of receive apparatuses and also within the individual receive apparatuses to a number of optical modulators.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography (MRT) system comprising:
   a plurality of receive apparatuses for a magnetic resonance high frequency (MR-HF) signal, wherein at least one receive apparatus of the plurality of receive apparatuses comprises a receive coil element for receiving the MR-HF signal;
   an optical modulator, in which an electrical control input is coupled to the receive coil element;
   an optical output operable to output an output signal of the optical modulator, wherein the optical modulator is operable to optically demodulate the MR-HF signal, and an optical input of the optical modulator is coupled to a laser light source that is configured to generate a laser light, a light intensity of the laser light varying periodically with a predetermined frequency; and
   an optical splitter that is configured to feed the laser light of the laser light source to the plurality of receive apparatuses or a plurality of modulators of the at least one receive apparatus of the plurality of receive apparatuses.

2. The MRT system as claimed in claim 1, wherein the laser light source is arranged outside of the at least one receive apparatus, and the laser light is transmittable via a light guiding device to the at least one receive apparatus.

3. The MRT system as claimed in claim 2, further comprising an opto-electronic converter, using which the optical output signal of the optical modulator is convertible into an electrical signal,
   wherein the opto-electronic converter has an optical sensitivity that is dependent on a modulation frequency of the optical output signal to be converted, and
   wherein a low pass characteristic of the optical sensitivity exhibits a limit frequency that lies between two mixed products formed by the optical demodulation.

4. The MRT system as claimed in claim 2, wherein the predetermined frequency lies in a range of 50 MHz to 500 MHz.

5. The MRT system as claimed in claim 1, further comprising an opto-electronic converter, using which the optical output signal of the optical modulator is convertible into an electrical signal,
   wherein the opto-electronic converter has an optical sensitivity that is dependent on a modulation frequency of the optical output signal to be converted, and
   wherein a low pass characteristic of the optical sensitivity exhibits a limit frequency that lies between two mixed products formed by the optical demodulation.

6. The MRT system as claimed in claim 1, wherein the predetermined frequency lies in a range of 50 MHz to 500 MHz.

7. The MRT system as claimed in claim 1, wherein the laser light source comprises a Mach-Zehnder modulator operable to vary the light intensity.

8. The MRT system as claimed in claim 1, wherein the optical modulator comprises a Mach-Zehnder modulator, the optical input of the Mach-Zehnder modulator being coupled via two optical propagation paths to the optical output of the optical modulator, and an optical wavelength of the two propagation paths is different when a control voltage of 0V is applied to the electrical control input.

9. The MRT system as claimed in claim 1, wherein the optical modulator includes a Mach-Zehnder modulator, wherein an active modulation length of the Mach-Zehnder modulator, via which the electrical input signal acts on the optical input signal, is greater than 2 cm.

10. The MRT system as claimed in claim 9, wherein the active modulation length is greater than 3 cm.

11. The MRT system as claimed in claim 1, wherein the optical modulator is configured as a travelling wave modulator.

12. The MRT system as claimed in claim 1, wherein the at least one receive apparatus comprises a tuning and detuning device that is switchable as a function of a strength of a receive signal of the receive coil element.

13. The MRT system as claimed in claim 1, wherein the at least one receive apparatus comprises a tuning and detuning device that is switchable optically.

14. The MRT system as claimed in claim 1, wherein the at least one receive apparatus comprises a plurality of tuning and detuning devices, wherein the plurality of tuning and detuning devices is switchable by a same signal.

15. The MRT system as claimed in claim 1, further comprising an energy transmission device, using which energy for operating electrical components of the at least one receive apparatus is transmittable to the at least one receive apparatus,
   wherein the energy is transmittable electromagnetically or by vibrations.

16. The MRT system as claimed in claim 15, wherein the energy is transmittable electromagnetically in a microwave range.

17. At least one receive apparatus of a plurality of receive apparatuses for a magnetic resonance tomography (MRT) system, the at least one receive apparatus being for a magnetic resonance high frequency (MR-HF) signal and comprising:
   a receive coil element operable to receive the MR-HF signal,
   wherein the MRT system comprises:
      an optical modulator, in which an electrical control input is coupled to the receive coil element;
      an optical output operable to output an output signal of the optical modulator, wherein the optical modulator is operable to optically demodulate the MR-HF signal, and an optical input of the optical modulator is coupled to a laser light source that is configured to generate a laser light, a light intensity of the laser light varying periodically with a predetermined frequency; and
      an optical splitter that is configured to feed the laser light of the laser light source to the plurality of receive apparatuses or a plurality of modulators of the receive apparatus of the plurality of receive apparatuses.

18. A method for obtaining a magnetic resonance (MR) signal in a magnetic resonance tomography (MRT) system, the method comprising:
   converting an electromagnetic, a magnetic, or an electromagnetic and magnetic resonance high frequency (MR-HF) signal that is emitted by a body to be examined in a magnetic field of the MRT system using a receive coil element into an electrical MR-HF signal;

modulating, as a function of the electrical MR-HF signal, a light intensity of a laser light using an optical modulator, wherein the laser light is generated by a laser light source that varies an intensity of the laser light periodically with a predetermined frequency, such that during modulation of the laser light with the MR-HF signal, an optical output signal of the optical modulator includes the MR signal as a demodulated MR-HF signal; and feeding the laser light of the laser light source, using an optical splitter, to a plurality of receive apparatuses or a plurality of modulators of a receive apparatus of the plurality of receive apparatuses.

19. A magnetic resonance tomography (MRT) system comprising:

at least one receive apparatus for a magnetic resonance high frequency (MR-HF) signal, wherein the at least one receive apparatus comprises a receive coil element for receiving the MR-HF signal;

an optical modulator, in which an electrical control input is coupled to the receive coil element;

an optical output operable to output an output signal of the optical modulator, wherein the optical modulator is operable to optically demodulate the MR-HF signal, and an optical input of the optical modulator is coupled to a laser light source that is configured to generate a laser light, a light intensity of the laser light varying periodically with a predetermined frequency; and an opto-electronic converter, using which the optical output signal of the optical modulator is convertible into an electrical signal, wherein the opto-electronic converter has an optical sensitivity that is dependent on a modulation frequency of the optical output signal to be converted, wherein a low pass characteristic of the optical sensitivity exhibits a limit frequency that lies between two mixed products formed by the optical demodulation, and wherein the limit frequency lies below the Larmor frequency of the MRT system.

* * * * *